(12) United States Patent
Megrant

(10) Patent No.: US 12,396,373 B2
(45) Date of Patent: Aug. 19, 2025

(54) QUANTUM INFORMATION PROCESSING DEVICE FORMATION

(71) Applicant: Google LLC, Mountain View, CA (US)

(72) Inventor: Anthony Edward Megrant, Goleta, CA (US)

(73) Assignee: Google LLC, Mountain View, CA (US)

(*) Notice: Subject to any disclaimer, the term of this patent is extended or adjusted under 35 U.S.C. 154(b) by 69 days.

(21) Appl. No.: 18/198,192

(22) Filed: May 16, 2023

(65) Prior Publication Data

US 2024/0023461 A1   Jan. 18, 2024

Related U.S. Application Data

(63) Continuation of application No. 16/640,399, filed as application No. PCT/US2017/065017 on Dec. 7, 2017, now Pat. No. 11,696,515.

(60) Provisional application No. 62/552,927, filed on Aug. 31, 2017.

(51) Int. Cl.
*H10N 60/01* (2023.01)
*G06N 10/40* (2022.01)

(52) U.S. Cl.
CPC ......... *H10N 60/0912* (2023.02); *G06N 10/40* (2022.01); *H10N 60/01* (2023.02)

(58) Field of Classification Search
CPC ..... H10N 60/0912; H10N 60/01; G06N 10/00
See application file for complete search history.

(56) References Cited

U.S. PATENT DOCUMENTS

| | | | |
|---|---|---|---|
| 5,194,833 A * | 3/1993 | Dougherty | H01P 5/028 333/33 |
| 5,219,713 A | 6/1993 | Robinson | |
| 6,812,810 B2 * | 11/2004 | Ma | B81B 7/0006 333/262 |

(Continued)

FOREIGN PATENT DOCUMENTS

| | | |
|---|---|---|
| JP | H4162578 | 6/1992 |
| JP | 1996-500702 | 1/1996 |

(Continued)

OTHER PUBLICATIONS

Chang et al., "Gas-phase silicon micromachining with xenon difluoride," Proc. SPIE 2641, Microelectronic Structures and Microelectromechanical Devices for Optical Processing and Multimedia Applications, Sep. 1995, 2641:117-128.

(Continued)

*Primary Examiner* — Ermias T Woldegeorgis
(74) *Attorney, Agent, or Firm* — Fish & Richardson P.C.

(57) ABSTRACT

A method for forming at least part of a quantum information processing device is presented. The method includes providing a first electrically-conductive layer formed of a first electrically-conductive material on a principal surface of a substrate, depositing a layer of dielectric material on the first electrically-conductive material, patterning the layer of dielectric material to form a pad of dielectric material and to reveal a first region of the first electrically-conductive layer, depositing a second electrically-conductive layer on the pad of dielectric material and on the first region of the first electrically-conductive layer, patterning the second electrically-conductive layer and removing the pad of dielectric material using isotropic gas phase etching.

17 Claims, 10 Drawing Sheets

(56) References Cited

U.S. PATENT DOCUMENTS

| | | | |
|---|---|---|---|
| 6,969,630 B2 | 11/2005 | Ozgur | |
| 7,154,088 B1 | 12/2006 | Blain et al. | |
| 7,928,375 B1 | 4/2011 | Mangan et al. | |
| 8,182,707 B2 | 5/2012 | Laermer et al. | |
| 9,564,573 B1* | 2/2017 | Chang | H10N 60/0912 |
| 10,043,667 B2 | 8/2018 | Yan et al. | |
| 2004/0191937 A1 | 9/2004 | Patel et al. | |
| 2015/0340584 A1 | 11/2015 | Chang et al. | |
| 2016/0322693 A1 | 11/2016 | Chang et al. | |
| 2017/0033273 A1 | 2/2017 | Chang et al. | |
| 2019/0089033 A1* | 3/2019 | Adiga | H01P 11/003 |

FOREIGN PATENT DOCUMENTS

| | | |
|---|---|---|
| JP | H08-500702 | 1/1996 |
| KR | 10-0704518 | 4/2007 |
| KR | 10-2010-0078312 | 7/2010 |
| KR | 10-2016-0147988 | 12/2016 |
| WO | WO 0114838 | 3/2001 |
| WO | WO 2015183535 | 12/2015 |

OTHER PUBLICATIONS

Chen et al., "Fabrication and Characterization of Aluminum Airbridges for Superconducting Microwave Circuits," Appl. Phys. Lett., Feb. 2014, 104:052602.

Chiaverini et al., "Surface-Electrode Architecture for Ion-Trap Quantum Information Processing," Quantum Information and Computation, retrieved from URL <https://tsapps.nist.gov/publication/get_pdf.cfm?pub_id=50014>, 2005, 5(6):419-439.

Decision to Grant a Patent in Japanese Appln. No. 2020-512482, dated Dec. 6, 2021, 5 pages (with English translation).

Holmes et al., "A vapour etching technique for the photolithography of silicon dioxide," Microelectronics Reliability, Nov. 1966, 5(4):337-341.

Megrant, "Simulating Quantum Chemical Dynamics with Improved Superconducting Qubits," Dissertation for the degree of Doctor of Philosophy, University of California, Santa Barbra, Sep. 2016, 199 pages.

Notice of Acceptance for Patent Application in Australian Appln. No. 2017429630, dated Jan. 19, 2022, 3 pages.

Notice of Allowance in Korean Appln. No. 10-2020-7007636, dated Jan. 27, 2022, 3 pages (with English translation).

Office Action in Australian Appln. No. 2017429630, dated Jan. 20, 2021, 7 pages.

Office Action in Australian Appln. No. 2017429630, dated Oct. 6, 2021, 4 pages.

Office Action in Canadian Appln. No. 3,074,067, dated May 26, 2021, 4 pages.

Office Action in Canadian Appln. No. 3,074,067, dated May 4, 2022, 4 pages.

Office Action in Chinese Appln. No. 201780094503.1, dated Dec. 23, 2022, 16 pages (with English translation).

Office Action in Korean Appln. No. 10-2020-7007636, dated Apr. 30, 2021, 14 pages (with English translation).

Office Action in Korean Appln. No. 10-2020-7007636, dated Nov. 29, 2021, 6 pages (with English translation).

PCT International Preliminary Report on Patentability in International Appln. No. PCT/US2017/065017, mailed Mar. 12, 2020, 10 pages.

PCT International Search Report and Written Opinion in International Appln. No. PCT/US2017/065017, mailed May 28, 2018, 18 pages.

Spts.com [online] "Introduction to HF Vapor Etch," May 2016, retrieved on Oct. 21, 2021, retrieved from: URL https://www.spts.com/assets/media/hf-intro-a4-02-09-2019.pdf, 2 pages.

\* cited by examiner

S4

S5

S6

S7

S8

S9

S3

S4

S5

S6

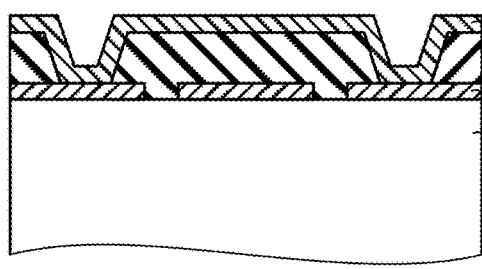 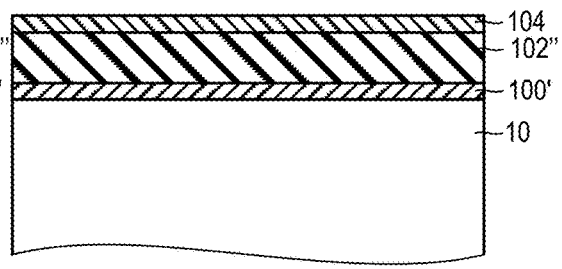
FIG. 2G  FIG. 3G
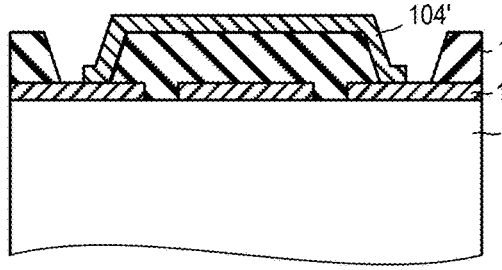 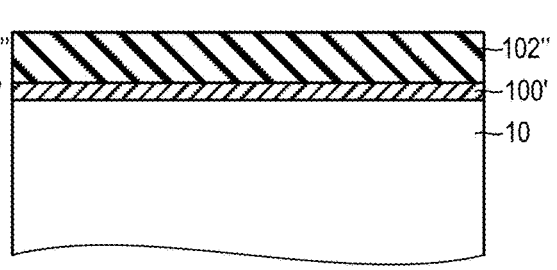
FIG. 2H  FIG. 3H
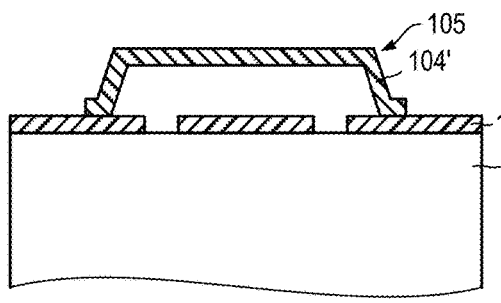 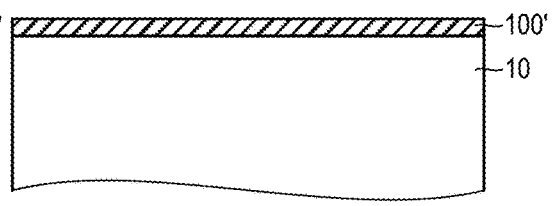
FIG. 2I  FIG. 3I
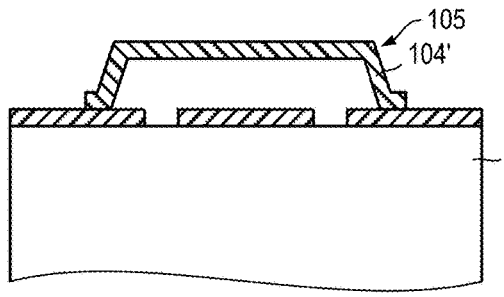 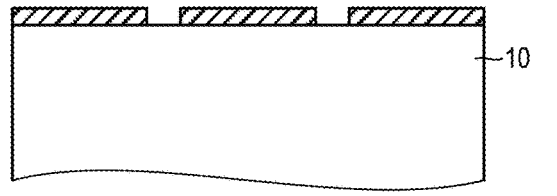
FIG. 2J  FIG. 3J

QUANTUM INFORMATION PROCESSING DEVICE FORMATION

CROSS-REFERENCE TO RELATED APPLICATIONS

This application is a continuation of U.S. patent application Ser. No. 16/640,399, filed Feb. 20, 2020, which is a National Stage Application under 35 U.S.C. § 371 and claims the benefit of International Application No. PCT/US2017/065017, filed on Dec. 7, 2017, which claims priority to U.S. Provisional Application Ser. No. 62/552,927, filed on Aug. 31, 2017. The disclosures of each of those prior applications are incorporated herein by reference in their entirety

TECHNICAL FIELD

The present disclosure relates to quantum information processing device formation.

BACKGROUND

Quantum computing is a new computing method that takes advantage of quantum mechanical phenomena, such as superposition of two quantum states and entanglement between the quantum states belonging to separate and remote entities. In contrast to a digital computer, which stores and manipulates the information using "bits" configured to be in two bi-stable states (e.g. a "0" and "1"), quantum computing systems aim to manipulate information using "qubits" configured to be the superposition of the quantum states (e. g. $a|0>+b|1>$). Quantum states of each qubit can be entangled with one another, i.e., the measurement result of one qubit is strongly correlated with the measurement result of another qubit. These properties provide a crucial advantage over the classical computer that the speed of a quantum computer is exponential in the number of qubits.

SUMMARY

In general, in some aspects, the subject matter of the present disclosure may be embodied in methods, which include: forming at least part of a quantum information processing device, which includes: providing a first electrically-conductive layer formed of a first electrically-conductive material on a principal surface of a substrate, depositing a layer of dielectric material on the first electrically-conductive material, patterning the layer of dielectric material to form a pad of dielectric material and to reveal a first region of the first electrically-conductive layer; depositing a second electrically-conductive layer on the pad of dielectric material and on the first region of the first electrically-conductive layer, patterning the second electrically-conductive layer; and removing the pad of dielectric material using isotropic gas phase etching.

Implementations of the methods may include one or more of the following features. For example, in some implementations, patterning the layer of dielectric material may reveal a first region of the first electrically-conductive layer.

In some implementations, patterning the layer of dielectric material may reveal a second region of the first electrically-conductive layer and the second electrically-conductive layer may be deposited on the second region of the first electrically-conductive layer.

In some implementations, removing the at least one patterned region of dielectric material using isotropic gas phase etching may include etching the at least one patterned region of dielectric material using a mixture which includes hydrogen fluoride vapour.

In some implementations, removing the at least one patterned region of dielectric material using isotropic gas phase etching may include etching the at least one patterned region of dielectric material using a mixture which includes xenon difluoride vapour.

In some implementations, the method further may include patterning the first electrically-conductive layer so as to form at least one window in the layer of first electrically-conductive layer.

In some implementations, patterning the second electrically-conductive layer may define a strip of second electrically-conductive material.

In some implementations, the substrate may comprise a silicon substrate.

In some implementations, the first electrically-conductive layer may comprise a metallization. Thus, the first electrically-conductive layer may be a first metallization layer.

In some implementations, the first electrically-conductive layer may be superconducting below a critical temperature.

In some implementations, the first electrically-conductive layer may comprise aluminium.

In some implementations, the layer of dielectric material may comprise a layer of silicon dioxide.

In some implementations, the second electrically-conductive layer may comprise a metallization. Thus, second electrically-conductive layer may be a second metallization layer.

In some implementations, the second electrically-conductive layer may be superconducting below a critical temperature.

In some implementations, the second electrically-conductive layer may comprise aluminium.

In some implementations, the first and second electrically-conductive layers may be formed of the same electrically-conductive material.

In some implementations, the first and second electrically-conductive layers may be formed of two, different electrically-conductive materials.

In some implementations, forming the at least part of the quantum information processing device may comprise forming an air bridge.

In some implementations, forming the at least part of the quantum information processing device may comprise forming a capacitor.

In some implementations, forming the at least part of the quantum information processing device may comprise forming an inductor.

In some implementations, forming the at least part of the quantum information processing device may comprise forming a resonator.

In some implementations, forming the at least part of the quantum information processing device may include using CMOS-compatible processing steps.

The subject matter of the present disclosure may be embodied a device obtainable by the any one of the implementations above.

Implementations may include one or more of the following advantages. A suspended structure, such as a metallic bridge, may be formed which provide a higher degree of integration and an extended degree of freedom to the circuit design. Since the electrical connections do not all have to run within the same layer, the length of the connections can be reduced or minimised compared to the operating wavelength of the microwave. This can eliminate the need to consider the additional phase shifts introduced by the length of the connections.

For the purposes of this disclosure, a superconductor (alternatively, superconducting) material may be understood as a material that exhibits superconducting properties at or below a superconducting critical temperature.

Examples of superconductor material include aluminum (superconducting critical temperature of, e.g., 1.2 kelvin), niobium (superconducting critical temperature of, e.g., 9.3 kelvin) and titanium nitride (superconducting critical temperature of, e.g., 5.6 kelvin).

The details of one or more implementations are set forth in the accompanying drawings and the description below. Other features and advantages will be apparent from the description, the drawings, and the claims.

BRIEF DESCRIPTION OF THE DRAWINGS

FIGS. 2A-2J illustrate a cross section view of a process of patterning of a first electrically-conductive layer on a dielectric substrate and building an electrically-conductive bridge rising over the first electrically-conductive layer along bridge line A-A' shown in FIG. 1A.

FIGS. 3A-3J illustrate a cross section view of a process of patterning of a first electrically-conductive layer on a dielectric substrate and building an electrically-conductive bridge rising over the first electrically-conductive layer, along a line B-B' shown in FIG. 1A.

DETAILED DESCRIPTION

Figure 1A:
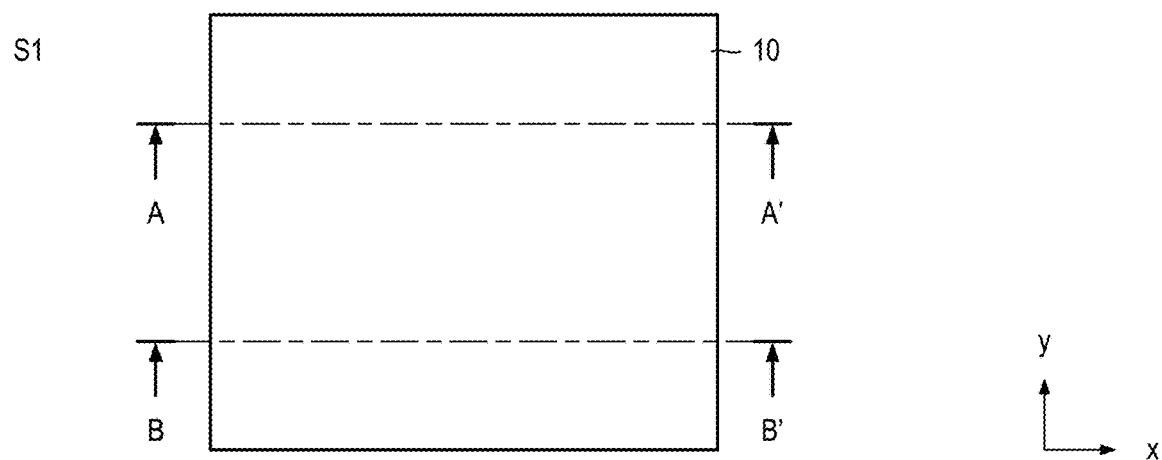
FIGS. 1A-1J illustrate a top view of a process of patterning of a first electrically-conductive layer on a dielectric substrate and building an electrically-conductive bridge rising over the first electrically-conductive layer.
Figure 1B:
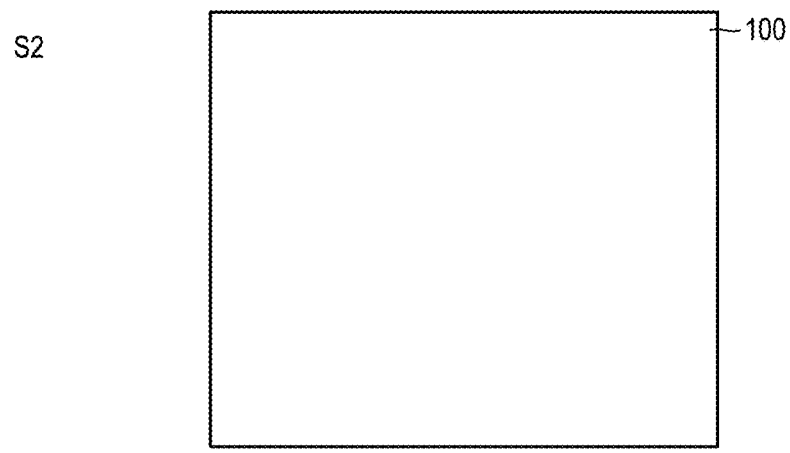
Figure 1C:
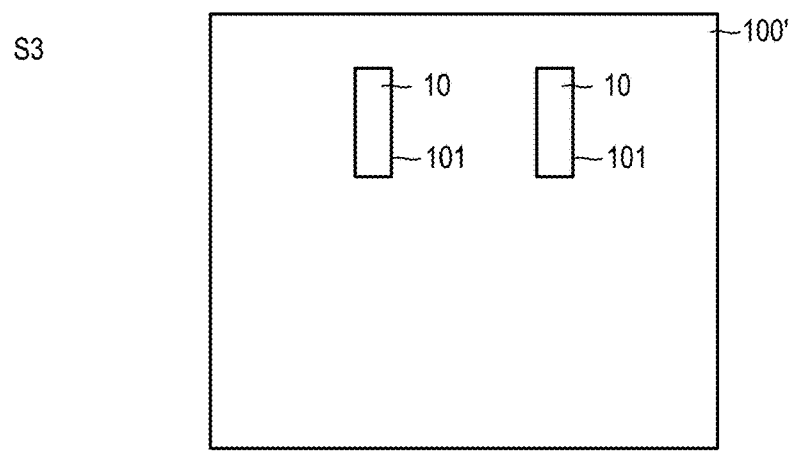
Figure 1D:
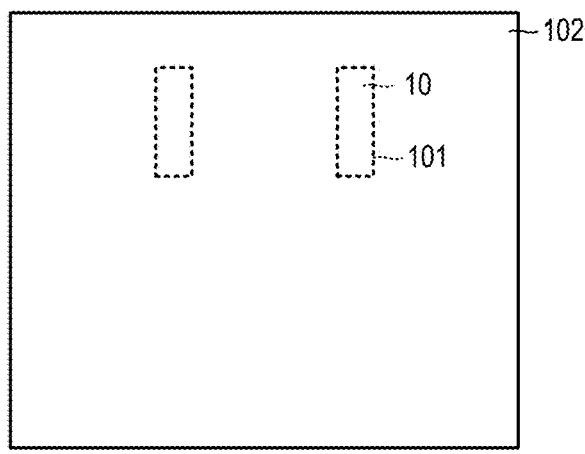
Figure 1E:
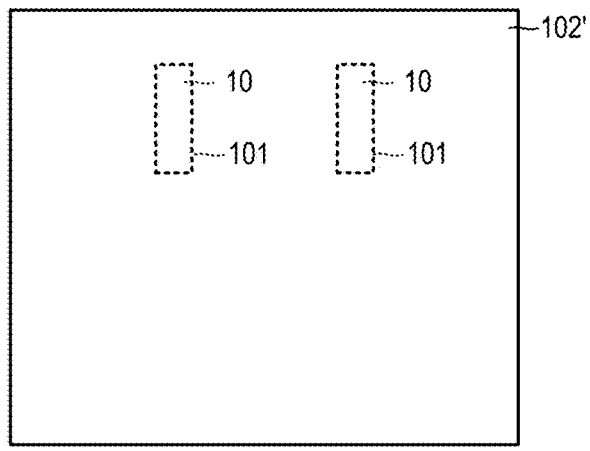
Figure 1F:
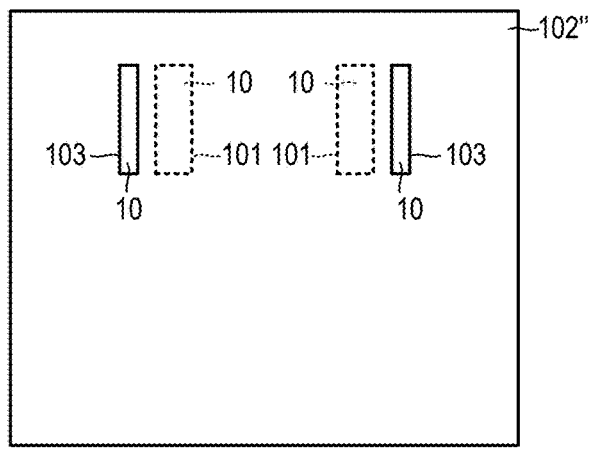
Figure 1G:
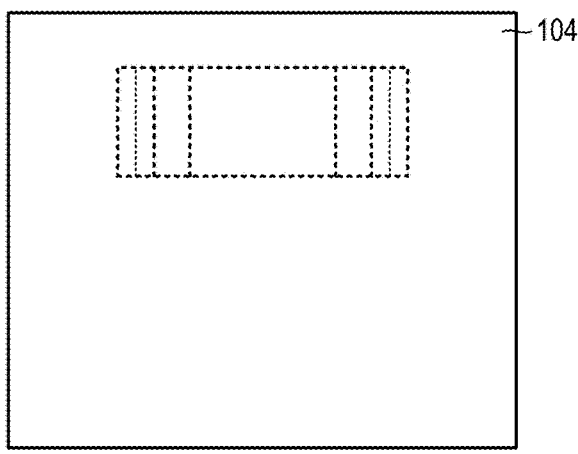
Figure 1H:
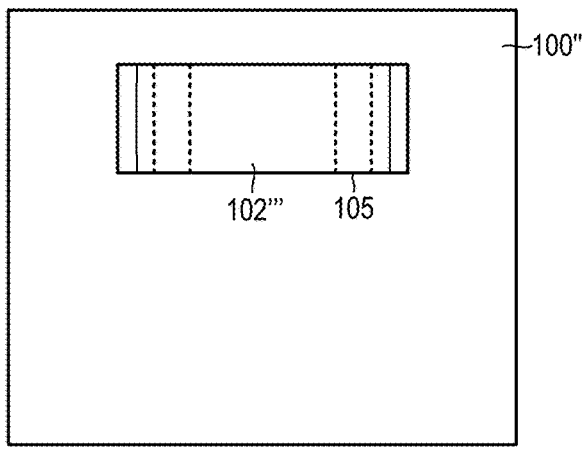
Figure 1I:
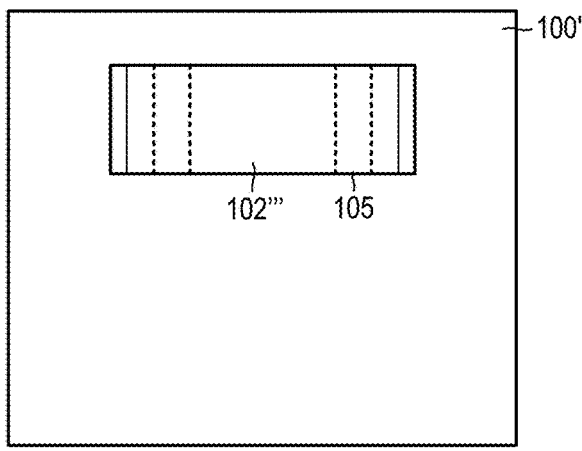

Quantum computing provides coherent processing of quantum information stored in a plurality of qubits of a quantum computer. To achieve maximum computational speed, ideally the qubits are entangled with one another in a controllable manner such that the quantum state of each qubit immediately affects the corresponding quantum states of the other qubits. Superconducting quantum computing is a promising implementation of quantum computing technology in which quantum circuits are formed at least in part from superconductor materials on a substrate. In certain implementations, quantum circuit elements are preferably operated at a cryogenic temperature such that thermal fluctuations do not perturb the coherence of the qubits or cause loss of the circuit elements at the operating frequency. Other factors that may lead to loss or decoherence are material defects such as two-level states (TLS) and undesired radiative coupling.

Therefore, an electrically-conductive layer, which shows superconducting behaviour below a critical temperature may be used to form various quantum circuit elements and components such as Josephson junction, co-planar waveguides, LC oscillator, superconducting quantum interference devices (SQUIDs), inductors, capacitors, among others. Superconducting quantum computing devices may be multilayer systems, however typically only the first electrically-conductive layer, which may be a metallic layer, forms the core of the computational basis.

In particular, this disclosure relates to a method of fabricating a suspended electrically-conductive structure, such as an airbridge for connecting two parts of a patterned electrically-conductive layer on a dielectric substrate.

Many components and connections between the components can be defined in a electrically-conductive layer supported by a dielectric substrate. It can be advantageous, however, to connect different parts of the circuit using a electrically-conductive "airbridge," which rises above the electrically-conductive layer and which forms an arch-like structure. Other circuit elements and connecting strips may be formed under the airbridge, while electrically disconnected from the two parts that are connected by the electrically-conductive airbridge.

These electrically-conductive bridges can be advantageous in that they provide a higher degree of integration and an extended degree of freedom to the circuit design. Since the electrical connections do not all have to run within the same layer, the length of the connections can be reduced or minimised compared to the operating wavelength of the microwave. This eliminates the need to consider the additional phase shifts introduced by the length of the connections.

An electrically-conductive bridge can be fabricated by reflowing photoresist, depositing metal and stripping the photoresist. However, the maximum height of the electrically-conductive bridge may be determined by (directly proportional to) the span of the bridge. This can lead to a tall structure, which makes the subsequent fabrication procedure difficult. Furthermore, these structures are not robust against spinning, sonication and baking. Finally, electrically-conductive bridge structures formed by reflowing photoresist is not compatible with foundry processing.

This disclosure presents a method of fabricating a suspended electrically-conductive structure, such as a metallic bridge, using an interlayer dielectric (ILD), such as silicon dioxide, to support the structure. This interlayer dielectric provides a strong structural support and is compatible with foundry processes.

An important part of the method is removing this interlayer dielectric after forming the electrically-conductive bridge. The method can substantially remove all trace of dielectric material in contact with the electrically-conductive layer during fabrication. The impact of residual dielectric material will now be explained.

The coherence time of each superconducting qubit defined by a Josephson junction (for example, Al-AlOx-Al interface) is a key parameter to be optimised for this specific type of quantum information processing devices. A major limiting factor to the coherence time of each qubit is the two-level states (TLS) inherently present in a dielectric substrate, originating from the tunnelling between two configurations of atoms within the dielectric substrate, or in some implementations at the interface between material layers.

In order to reduce decoherence, single crystal silicon or sapphire substrates can be used because this reduces the density of inherent two-level states (TLS). However, in addition to the base substrate, any dielectric layer in contact with the electrically-conductive layer during the course of fabrication leads to loss around the qubit transition frequency, typically at several GHz. Therefore, even a few atomic layers of oxide on the surface of the features defined in the electrically-conductive layer can seriously affect the operation of the elements within the quantum information processing device. For example, the quality factor of a coplanar waveguide resonator can be affected by minute amount of remaining dielectric material near the edge of the electrically-conductive features, where the magnitude of electric field is high. Therefore, it is a challenge to devise a foundry compatible fabrication method that minimises the effect of the dielectric material involved in the fabrication process.

This disclosure presents a method that includes steps for removing the lossy interlayer dielectric after forming the electrically-conductive bridge, such as a metallic bridge, and for selective etching of the layers and for ensuring etchant access. As a way of estimating the effect of the dielectric material, the quality factor of a coplanar waveguide resonator is measured before and after fabricating the airbridge across the coplanar waveguide resonator and compared.

The method will be described in detail below in relation to an example employing a metallic layer, in particular an aluminium layer, on a silicon substrate and silicon dioxide as the interlayer dielectric. However, the method can be used with any electrically-conductive and/or superconducting layer and any dielectric substrates. The techniques disclosed herein can be used to reduce the effect of dissipation of a circuit element by selectively removing dielectric material.

Application of the method is not limited to this specific type of quantum information processing devices or confined to the field of quantum information processing and the materials are not limited to aluminium on silicon or sapphire.

Figure 1J:
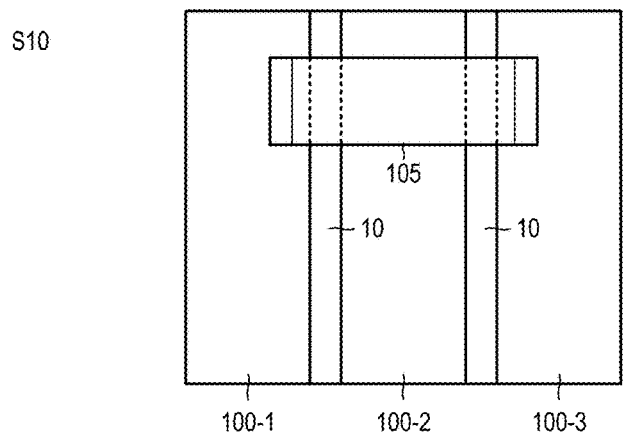
Figures 2A, 3A:
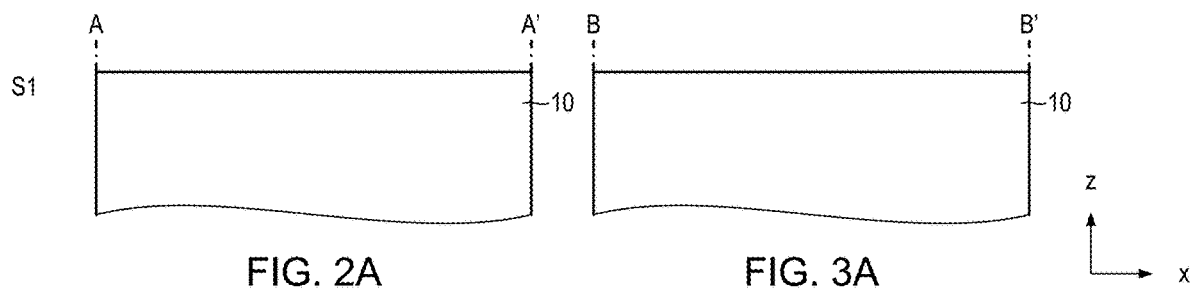
Figures 2B, 3B:
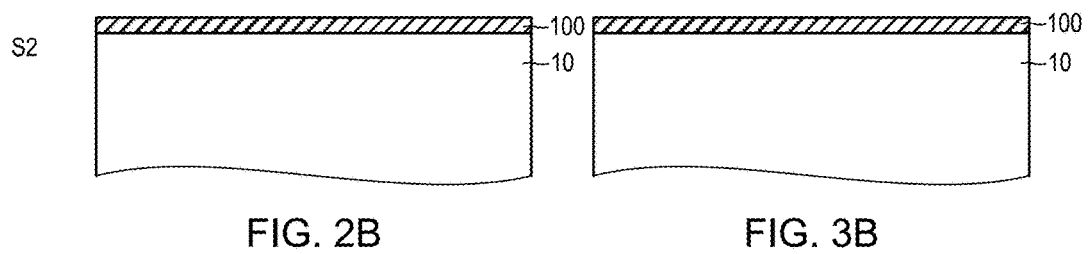
Figure 2C:
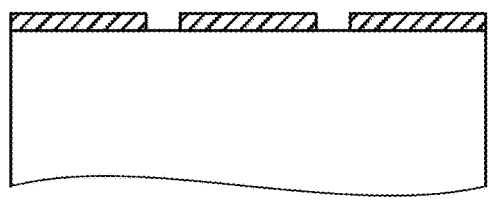
Figure 3C:
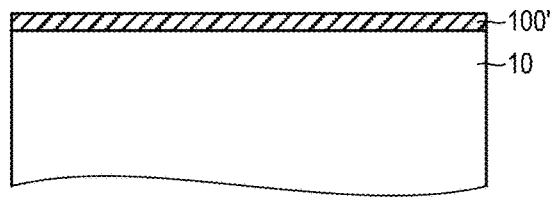
Figure 2D:
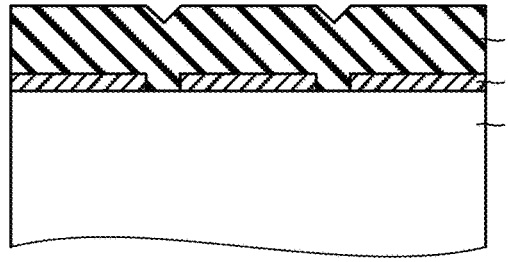
Figure 3D:
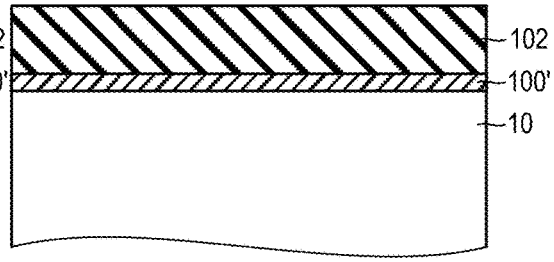
Figure 2E:
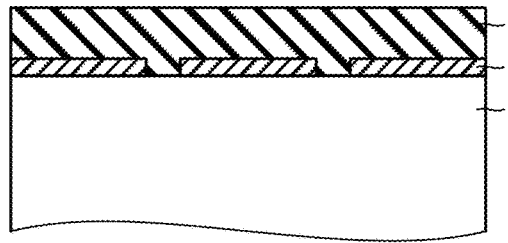
Figure 3E:
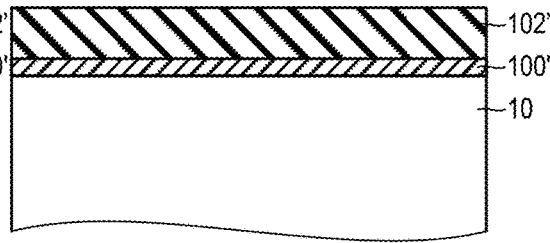
Figure 2F:
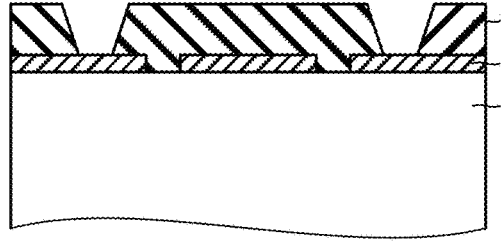
Figure 3F:
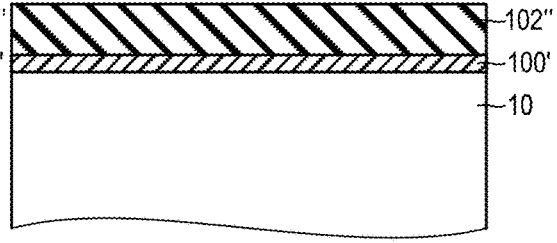
Figure 4:
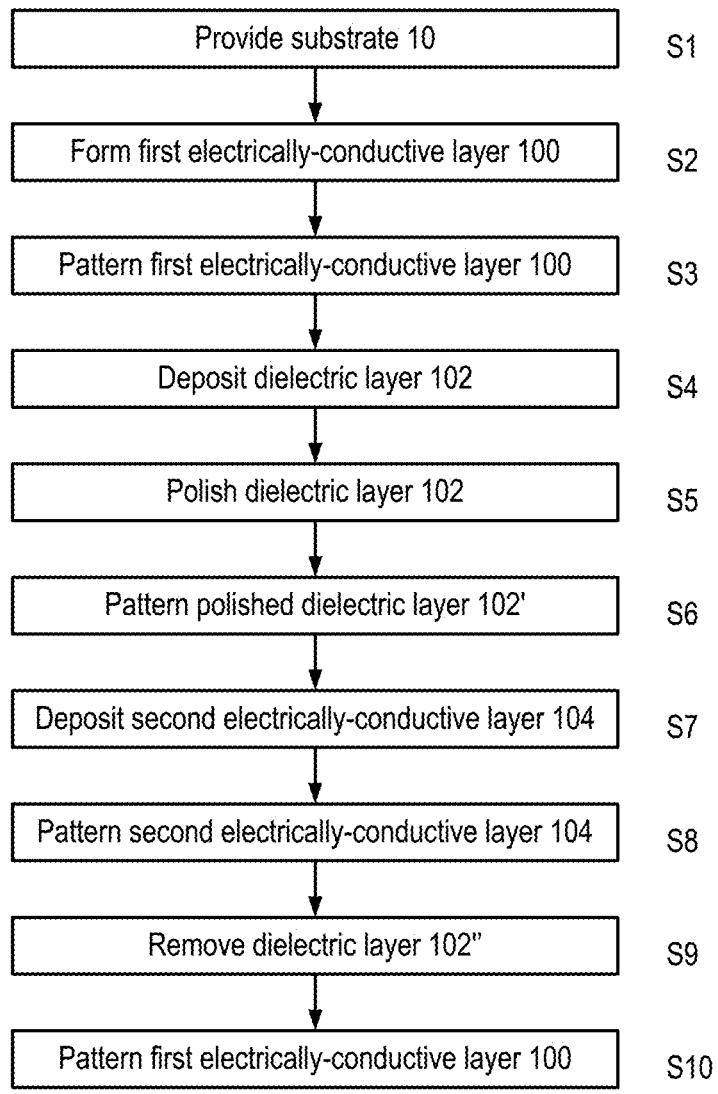
FIG. 4 is a process flow diagram of a method of patterning of a first electrically-conductive layer on a dielectric substrate and building an electrically-conductive bridge rising over the first electrically-conductive layer.

FIGS. 1A-1J show the processing steps as a top view to the substrate plane. FIGS. 2A-2J and 3A-3J show the processing steps as cross section views. In particular, as shown in FIG. 1J, this exemplary process aims at fabricating three vertically running aluminium (Al) strips within an electrically-conductive layer 100 on a substrate 10, in this case a silicon (Si) substrate, and an aluminium bridge 105 that electrically connects the leftmost aluminium strip 100-1 and the rightmost aluminium strip 100-3, shown to run horizontally. This method will now be described with reference to FIGS. 1A-1J, 2A-2J, 3A-3J and 4.

Referring to FIGS. 1A, 2A, 3A and 4, the substrate 10 in this example may be silicon (step S1). Alternatively, sapphire may be used as the substrate 10. Preferably, a single crystal silicon or sapphire may be used for the substrate to minimise the density of the two level states (TLS) within the substrate, as explained above. The bridge will eventually be formed along line A to A' in FIG. 1A. The cross sections along this line are shown in FIGS. 2A-2J. Line B to B' will be referenced to refer to the part of the substrate which does not support the bridge. The cross sections along this line are shown in FIGS. 3A-3J.

Referring to FIGS. 1B, 2B, 3B and 4, a first electrically-conductive layer 100, for example an aluminium layer, may be deposited uniformly over the substrate 10 (step S2). As discussed above, the components of the quantum information processing device, such as capacitors, inductors, coplanar waveguide resonators, and transmission lines will be patterned on the first electrically-conductive layer 100.

Referring to FIGS. 1C, 2C, 3C and 4, the first electrically-conductive layer 100 may be patterned (step S3). In this example, two holes 101 are formed "on-bridge," along line A to A' in FIG. 1A, such that the base silicon substrate 10 is exposed through the holes 101. The holes 101 correspond to the parts of the two vertically running trenches, separating the three aluminium strips 100-1, 100-2, 100-3 shown in FIG. 1J, that are positioned under the final bridge structure 105. The rest of the trenches in the first electrically-conductive layer 100' may be fabricated afterwards to be connected seamlessly to these holes later in the fabrication process. Alternatively, a complete pattern desired on the first electrically-conductive layer 100', for example the two complete trenches shown in FIG. 1J, can be fabricated in this step. Patterning of the first electrically-conductive layer 100' can be achieved by the steps including depositing a photoresist layer, UV exposure, developing the photoresist layer and anisotropic dry etching such as ion milling. Unless otherwise stated, any patterning mentioned below will follow this procedure.

Referring to FIGS. 1D, 2D, 3D and 4, a layer of dielectric material 102, for example a silicon dioxide layer may be deposited over the substrate such that the two holes formed in the first electrically-conductive layer 100 are covered (step S4). This layer 102 corresponds to the interlayer dielectric intended to support the electrically-conductive bridge structure. Small dimples may be formed over the two holes in the first electrically-conductive layer 100'.

Referring to FIGS. 1E, 2E, 3E and 4, the whole substrate may be planarized via chemical mechanical polishing (CMP) (step S5). This step minimizes the roughness introduced by the dimples around the two holes, which may affect the thickness and the uniformity of the subsequent layers. CMP is a well-known technique in the art, in which the substrate is mounted on a rotating plate and polished with a polishing pad, for example a polyurethane foam, containing the mixture of etchants and abrasive particles. The two holes remain marked as dotted squares in the FIG. 1E although when the CMP process is effective, the position of the two holes cannot be identified by inspecting the top surface of the layer of dielectric material 102', in this case the silicon dioxide layer.

Referring to FIGS. 1F, 2F, 3F and 4, the layer of dielectric material 102", in this case the silicon dioxide layer, may be patterned to form the supporting structure for the electrically-conductive bridge (step S6). In particular, the layer of dielectric material 102" may be patterned such that the part of the leftmost strip of the first electrically-conductive layer 100-1 and the part of the rightmost strip of the first electrically-conductive layer 100-3 to be contacted by the bridge are exposed. The solid line squares 103 represent these parts of the first electrically-conductive layer 100' that are exposed. Due to the etching procedure, slopes will form from the top surface of the layer of dielectric material 102" to the first electrically-conductive layer 100', for example if the layer of dielectric material 102" is a silicon dioxide layer. These slopes may eventually form the slanted legs of the bridge structure.

Referring to FIGS. 1G, 2G, 3G and 4, a second electrically-conductive layer 104 may be deposited over the whole substrate (step S7). Contacts form between the first electrically-conductive layer 100' and the second electrically-conductive layer 104 at the parts patterned to be exposed in the previous step 103. Contact parts are shown as trenches in FIG. 2F, which are partially filled by the second electrically-conductive layer 104 in FIG. 2G. Therefore, seen from the top, it is uniformly the material belonging to the second electrically-conductive layer 104, for example, aluminium, only sunken near the contact parts 103. The first electrically-conductive layer 100' and the second electrically-conductive layer 104 may comprise the same material. Alternatively, the first electrically-conductive layer 100' and the second electrically-conductive layer 104 may comprise different materials. The first electrically-conductive layer 100' and the second electrically-conductive layer 104 are not limited only to metallic materials as long as they exhibit an electrical conductivity to an extent suitable for the operation of the quantum computing devices.

Referring to FIGS. 1H, 2H, 3H and 4, the second electrically-conductive layer 104' may be patterned such that only the portion of the second electrically-conductive layer corresponding to the bridge remains and the rest is removed (step S8).

Referring also to FIGS. 1I, 2I, 3I and 4, the remaining silicon dioxide 102" may be etched isotropically and the bridge is completed (step S9). The isotropic etching in this step may selectively remove only the remaining dielectric material 102" and may not remove any of the material from the first electrically-conductive layer 100' and the second electrically-conductive layer 104'. In case that the layer of dielectric material 102" is a silicon dioxide layer, the silicon dioxide may be selectively removed using dry vapor HF (VHF) etching. For example, a PRIMAXX Dry VHF system offered by SPTS technology can facilitate such isotropic selective etching of the silicon dioxide layer. Alternatively, the silicon dioxide may be selectively removed by using plasma generated with tetrafluoromethane vapour or nitrogen trifluoride vapour. In some cases, a dielectric, e.g., silicon, may be selectively removed by using a vapour including xenon difluoride.

Referring to FIGS. 1J, 2J, 3J and 4, the "off-bridge" portion, for example along the line B to B' in FIG. 1A, of the first electrically-conductive layer 100 may be patterned (step S10).

Figure 5:
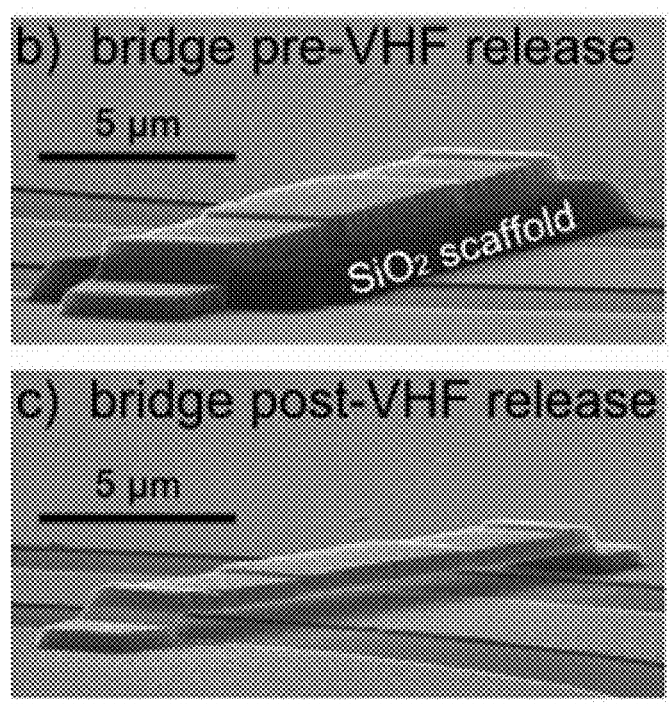
FIG. 5 is a micrograph of an example of a sacrificial silicon dioxide layer supporting an electrically-conductive bridge prior to isotropic VHF etching and subsequent to isotropic VHF etching.

Referring to FIG. 5, a micrograph of an example of a sacrificial silicon dioxide layer 102" supporting the metallic bridge 105 before and after isotropic VHF etching is shown. Unlike the procedure described in FIGS. 1 to 4, the first electrically-conductive layer 100 is completely patterned before depositing additional layers. Also, the silicon dioxide layer 102" was patterned down to the first electrically-conductive layer to define a bridge structure before VHF etching. FIG. 5 shows that these alternatives are possible.

Figure 6:
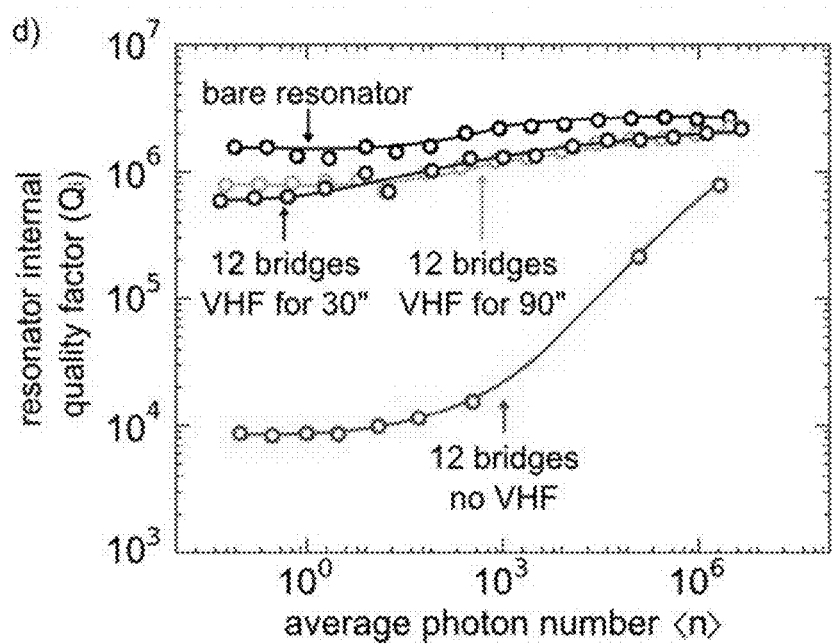
FIG. 6 shows measurements of quality factors of a resonator comprising a co-planar waveguide at various stages of the fabrication process.

Referring to FIG. 6, in order to estimate the effect of the trace of dielectric material from the interlayer dielectric material used and removed during the process, the quality factor of a resonator comprising a co-planar waveguide resonator can be measured before, during and after fabricating the metallic bridge 105.

These resonators can be defined as co-planar waveguides on the first electrically-conductive layer 100, in combination with suitable reflecting structures defined at each end of the resonator.

A co-planar waveguide includes a strip of metal defined in between the ground planes of metal on both sides of the strip of metal. Referring to FIG. 1J, the metal strip in the middle 100-2 and the two ground planes 100-1 and 100-3 neighbouring the metal strip 100-2 form a co-planar waveguide. Co-planar waveguides are used not only for forming a resonator, but also commonly used for wiring components and elements within the superconducting quantum circuits formed in the first electrically-conductive layer 100.

A problem with these co-planar waveguides is that, in some implementations, stray modes can occur due to the effective segmentation of the ground plane due to other interfering control wires on the chip. These stray modes can be suppressed to a large extent by electrically tying the ground planes with low impedance connections. The electrically-conductive bridge structure which can be fabricated following the process described herein can serve as such connections between the ground planes of co-planar waveguides.

FIG. 6 shows measurements of the quality factor of the resonators formed with a co-planar waveguide. The quality factor of a resonator reflects the degree of damping as electromagnetic wave resides within the mode of the resonator. For the purpose of our disclosure, a higher quality factor represents smaller effect of the trace of the dielectric material and vice versa.

The top curve of FIG. 6 shows the quality factor measured from a bare resonator, which comprises a central strip and two ground planes on each side of the central strip. As discussed above, stray electromagnetic modes may be present but it is assumed that the quality factor may be largely insensitive to these stray modes.

For each of the other three resonators, 12 metallic bridge structures were fabricated to electrically connect the ground planes, along the length of the resonator to suppress the stray electromagnetic modes. Therefore, in this example, the co-planar waveguides were patterned before fabricating the bridge structures on top. The extra step shown in FIG. 3J and step S10 was not performed, in which the remaining parts of the strip of waveguides off the metallic bridge structure are fabricated. As discussed above, the layer of dielectric material 102" were removed by dry vapor HF (VHF) etching (step S9).

The bottom curve of FIG. 6 shows the quality factors measured without any dry vapor HF (VHF) etching. In this case, the layer of dielectric material 102" remained as shown in FIGS. 2H and 3H. It can be observed that the quality factor overall is lower than that measured with the bare resonator.

It can also be observed that for a higher average photon number, the decrease of the quality factor is less severe. This is because the radiative coupling of two-level states (TLS) is saturated at higher intensities of the electromagnetic wave modes in the resonator. Saturation of response at a high excitation intensity is one of the unique properties of a quantum mechanical two-level systems. Therefore, this saturating effect may also show that the source of loss of the electromagnetic mode is the two-level states (TLS) inherently present in the dielectric material coupled to the electromagnetic modes of the co-planar waveguides. This may also suggest that the effect of the dielectric material can be measured more accurately at a lower intensity regime, in this example, near where the average photon number is 1000 or less. Near this low intensity regime, it can be observed that the layer of dielectric material 102 reduces the quality factor from the bare resonator by at least two orders of magnitude.

FIG. 6 also shows the measurements of the quality factor after dry vapor HF (VHF) etching was performed for 30 seconds and 90 seconds. At a lower average photon number regime, it can be seen that the dry vapor HF (VHF) etching for longer than 90 seconds improved the quality factor slightly, but not by much. This suggests that the optimal duration of the dry vapor HF (VHF) etching may be around a minute, for this specific structure. Compared to the bottom curve, the quality factor is seen to have improved by nearly two orders of magnitude, although the quality factor measured with the bare resonator may not be redeemed.

Therefore, the measurements shown in FIG. 6 may demonstrate that the process described herein can minimise the effect of the trace of the dielectric material used during the process of fabrication of electrically-conductive bridge structures.

Figure 7:
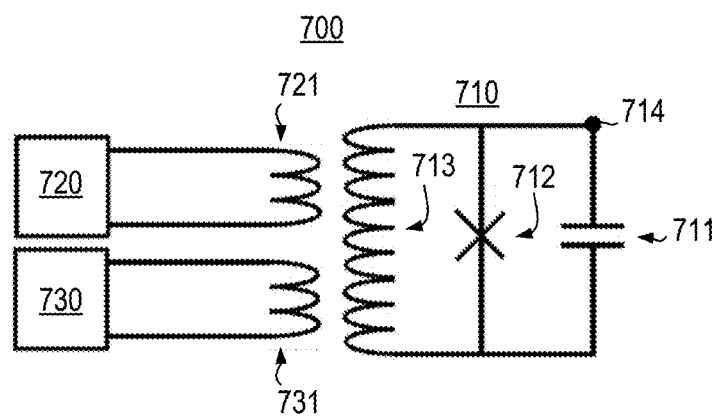
FIG. 7 shows a schematic diagram of a qubit circuit.

FIG. 7 shows a schematic diagram of a qubit circuit 700. A qubit 710 may function as an artificial atom or quantum mechanical two-level system, which can be implemented with a strongly anharmonic oscillator, which exhibits a series of energy levels whose level splitting decreases as the energy levels go higher. A strongly anharmonic oscillator may be implemented in the quantum circuits by shunting a parallel LC resonator, including a capacitor 711 and an inductor 713, with a Josephson junction 712. The Josephson junction 712 has a strongly nonlinear current-voltage relation, which depends on the phase across the junction and may be regarded as a nonlinear and tuneable inductor. The Josephson junction 712 may render the LC resonator strongly nonlinear and anharmonic in response to the applied voltage, therefore may render the qubit 710 an artificial atom or a quantum mechanical two-level system comprising a ground state and an excited state. The qubit 710 may be configured such that the main level splitting is around several GHz. This allows the qubit 710 to be addressed, controlled and measured at microwave frequency range.

A qubit control circuit 720 may generate these microwave pulses. The qubit 710 may be addressed by the qubit control circuit 720 via the interaction between the inductor 713 and the flux bias coil 721, which may be arranged in the vicinity of the inductor 713 of the qubit 710. The qubit control circuit 720 may generate excitation pulses to prepare the states of the qubit 710 for quantum computation operations and measurement pulses to prepare the states of the qubit 710 for measurements by a SQUID 730.

The SQUID 730, by interacting with the inductor 713 using a SQUID coil 731, may transduce a minute change of flux within the qubit 710 into voltage, which may be amplified and recorded outside the cryogenic condition.

A plurality of qubits 710 may be connected to one another by waveguides or resonators electrically connecting a terminal 714 of each qubit 710. The waveguides may include strip waveguides or co-planar waveguides. The resonators may be of length corresponding to half the operating microwave wavelength or a quarter of the operating microwave wavelength. The resonators may be used as a quantum bus, which facilitates drop-in and drop-out of the qubits to and from the quantum circuits such that all of the qubits are not connected to one another all the time. The resonators may also be used for the purpose of reading out the state of each qubit. In connecting a plurality of qubits 710, capacitors may be placed between the terminal 714 of each qubit 710 and connecting resonators to adjust impedance and coupling strength.

The design of the qubit circuit 700 is not limited to this specific example which exploits the phase across the Josephson junction and may include other types of circuits including or not including the Josephson junction, facilitating any design for artificial atoms or qubits, which can be formed by patterning one or more of electrically-conductive layers deposited on a substrate.

The process described herein can be not only used for the purpose of electric crossovers but also for the circuit elements used for the qubit circuit 100. For example, parallel-plate capacitors may be formed between the first electrically-conductive layer 100' and the second electrically-conductive layer 104', which may be the capacitor 711 of the qubit 710. Inductors may be formed as multiple loops of electrically-conductive strips within the first electrically-conductive layer 100' and the second electrically-conductive layer 104'. Alternatively, the inductor 713 may be patterned on the first electrically-conductive layer 100' and the flux bias coil 721 or the SQUID coil 731 may be patterned on the second electrically-conductive layer 104' such that they interact with each other. However, the uses of the process described herein are not limited to these examples. The bridge structure 105 may be used for other elements or components of the quantum circuits.

The process described herein may be used for fabricating a substantially suspended structure in the second electrically-conductive layer 104'. For example, a substantially elongated structure such as a microstrip resonator may be fabricated in the second electrically-conductive layer 104'. Adverse effects of dielectric material may be minimised if most of the layer of dielectric material 102" in contact with the structure is removed, leaving only a minimum possible amount of material in the layer of dielectric material 102" enough to mechanically support the structure such that the structure is suspended above the first electrically-conducting layer 100'. For example, to fabricate a strip resonator structure in the second electrically-conductive layer 104', a plurality of pillar-type portions may be fabricated from the layer of dielectric material 102". The pillar portions may be fabricated by widening the geometry in the locations along the length of the strip resonator structure where the pillars are to be located. Alternatively, the pillar portions may be fabricated also by depositing a different dielectric material for the pillar portions, selective to a different type of etchant than the one used for the remainder of the layer of dielectric material 102". Alternatively, the fabrication of pillar portions may be fabricated by fabricating release holes near where the pillar portions are to be located to locally increase the etching rate. For example, if a 1 μm long pillar portion may be fabricated for every 100 μm of a long floating segment, adverse effects from dielectric material may be reduced roughly by a factor of 100.

Figure 8A:
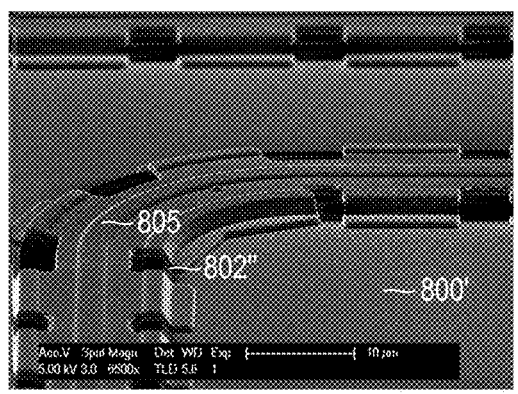
FIGS. 8A and 8B are micrographs of an example of a sacrificial silicon dioxide layer supporting a continuous airbridge structure present over a co-planar waveguide prior to and subsequent to isotropic VHF etching.
Figure 8B:
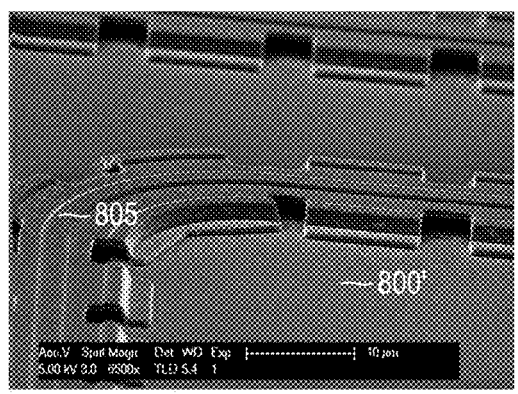

The process described herein can also be used to fabricate a continuous airbridge. As discussed above, stray modes present within a co-planar waveguide can be suppressed to a large extent by electrically tying the ground planes with electrically-conductive airbridge structures. The stray modes may be suppressed even further if the airbridge structures are present along the entire length of the co-planar waveguide. Referring to FIGS. 8A and 8B, micrographs of an example of a sacrificial silicon dioxide layer 802" supporting the electrically conductive bridge 805 before and after isotropic VHF etching are shown. In this example, a co-planar waveguide fabricated in the first electrically-conductive layer 800' runs with a bend, and a continuous metallic bridge 805 is present along the entire length of the co-planar waveguide shown in the micrographs, except the openings made for access of the dry vapor HF to etch the sacrificial silicon dioxide layer 802". The sacrificial layer 802", which can be seen through the openings made in the continuous airbridge 805 in FIG. 8A, is removed in FIG. 8B.

The process described herein can also be used for non-quantum circuit elements such as a part of a cantilever in MEMS devices.

Implementations of the quantum subject matter and quantum operations described in this specification may be implemented in suitable quantum circuitry or, more generally, quantum computational systems, including the structures disclosed in this specification and their structural equivalents, or in combinations of one or more of them. The term "quantum computing systems" may include, but is not limited to, quantum computers, quantum information processing systems, quantum cryptography systems, or quantum simulators.

The terms quantum information and quantum data refer to information or data that is carried by, held or stored in quantum systems, where the smallest non-trivial system is a qubit, e.g., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, molecules, electrons, photons, ions, quantum dots or superconducting qubits. In many implementations the computational basis states are identified with the ground and first excited states, however it is understood that other setups where the computational states are identified with higher level excited states are possible. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Quantum circuit elements may be used to perform quantum processing operations. That is, the quantum circuit elements may be configured to make use of quantum-mechanical phenomena, such as superposition and entanglement, to perform 15 operations on data in a non-deterministic manner. Certain quantum circuit elements, such as qubits, may be configured to represent and operate on information in more than one state simultaneously. Examples of superconducting quantum circuit elements that may be formed with the processes disclosed herein include circuit elements such as co-planar waveguides, quantum LC oscillators, qubits (e.g., flux qubits or charge qubits), superconducting quantum interference devices (SQUIDs) (e.g., RF-SQUID or DCSQUID), inductors, capacitors, transmission lines, ground planes, among others.

In contrast, classical circuit elements generally process data in a deterministic manner. Classical circuit elements may be configured to collectively carry out instructions of a computer program by performing basic arithmetical, logical, and/or input/output operations on data, in which the data is represented in analog or digital form.

In some implementations, classical circuit elements may be used to transmit data to and/or receive data from the quantum circuit elements through electrical or electromagnetic connections. Examples of classical circuit elements that may be formed with the processes disclosed herein include rapid single flux quantum (RSFQ) devices, reciprocal quantum logic (RQL) devices and ERSFQ devices, which are an energy-efficient version of RSFQ that does not use bias resistors. Other classical circuit elements may be formed with the processes disclosed herein as well.

During operation of a quantum computing system that uses superconducting quantum circuit elements and/or superconducting classical circuit elements, such as the circuit elements described herein, the superconducting circuit elements are cooled down within a cryostat to temperatures that allow a superconductor material to exhibit superconducting properties.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub-combination.

Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. For example, the actions recited in the claims can be performed in a different order and still achieve desirable results. In certain circumstances, multitasking and parallel processing may be advantageous. Moreover, the separation of various components in the implementations described above should not be understood as requiring such separation in all implementations.

Processes described herein may entail the deposition of one or more materials, such as superconductors, dielectrics and/or metals. Depending on the selected material, these materials may be deposited using deposition processes such as chemical vapor deposition, physical vapor deposition (e.g., evaporation or sputtering), or epitaxial techniques, among other deposition processes. Processes described herein may also entail the removal of one or more materials from a device during fabrication. Depending on the material to be removed, the removal process may include, e.g., wet etching techniques, dry etching techniques, or lift-off processes.

A number of implementations have been described. Nevertheless, it will be understood that various modifications may be made without departing from the spirit and scope of the invention. Other implementations are within the scope of the following claims.

What is claimed is:

1. A method, comprising:
   forming at least part of a quantum information processing device, the method comprising:
   providing a first electrically-conductive layer formed of a first electrically-conductive material on a principal surface of a substrate;
   depositing a layer of dielectric material on the first electrically-conductive material;
   patterning the layer of dielectric material to form at least one patterned region of dielectric material and to reveal a first region of the first electrically-conductive layer, wherein the at least one patterned region is formed as a support for a suspended electrically-conductive structure, and wherein the suspended electrically-conductive structure rises above the first electrically-conductive layer and directly contacts two regions of the first electrically-conductive layer;
   depositing a second electrically-conductive layer on the at least one patterned region of the dielectric material and on the two regions of the first electrically-conductive layer;

patterning the second electrically-conductive layer such that only a first portion of the second electrically-conductive layer corresponding to the suspended electrically-conductive structure remains and a second portion not corresponding to the suspended electrically-conductive structure is removed; and removing the at least one patterned region of dielectric material using isotropic gas phase etching, wherein removing the at least one patterned region of dielectric material using isotropic gas phase etching comprises etching the at least one patterned region of dielectric material using a mixture which includes hydrogen fluoride vapor or using a mixture which includes xenon difluoridevapor.

2. The method of claim 1, wherein patterning the layer of dielectric material reveals a second region of the first electrically-conductive layer and the second electrically-conductive layer is deposited on the second region of the first electrically-conductive layer.

3. The method of claim 1, further comprising:
patterning the first electrically-conductive layer so as to form at least one window in the layer of the first electrically-conductive layer.

4. The method of claim 1, wherein patterning the second electrically-conductive layer defines a strip of second electrically-conductive.

5. The method of claim 1, wherein the substrate comprises a silicon substrate.

6. The method of claim 1, wherein the first electrically-conductive layer is a first metallization layer.

7. The method of claim 1, wherein the first electrically-conductive layer is superconducting below a critical temperature.

8. The method of claim 1, wherein the first electrically-conductive layer comprises aluminum.

9. The method of claim 1, wherein the layer of dielectric material comprises a layer of silicon dioxide.

10. The method of claim 1, wherein the second electrically-conductive layer is a second metallization layer.

11. The method of claim 1, wherein the second electrically-conductive layer is superconducting below a critical temperature.

12. The method of claim 1, wherein the second electrically-conductive layer comprises aluminum.

13. The method of claim 1, wherein forming the at least part of the quantum information processing device comprises forming an airbridge.

14. The method of claim 1, wherein forming the at least part of the quantum information processing device comprises forming a capacitor.

15. The method of claim 1, wherein forming the at least part of the quantum information processing device comprises forming an inductor.

16. The method of claim 1, wherein forming the at least part of the quantum information processing device comprises forming aresonator.

17. The method of claim 1, wherein forming the at least part of the quantum information processing device includes using CMOS-compatible processing steps.

* * * * *